(12) United States Patent
Chou et al.

(10) Patent No.: US 8,719,759 B1
(45) Date of Patent: May 6, 2014

(54) AREA OPTIMIZED SERIES GATE LAYOUT STRUCTURE FOR FINFET ARRAY

(71) Applicant: Taiwan Semiconductor Manufacturing Co. Ltd., Hsin-Chu (TW)

(72) Inventors: Wen-Shen Chou, Zhubei (TW);
Chin-Hua Wen, Toufen Township (TW);
Yung-Chow Peng, Hsinchu (TW);
Chih-Chiang Chang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/778,403

(22) Filed: Feb. 27, 2013

(51) Int. Cl.
*G06F 17/50* (2006.01)

(52) U.S. Cl.
CPC ........ *G06F 17/5081* (2013.01); *G06F 17/5077* (2013.01); *G06F 17/5072* (2013.01)
USPC ........... 716/135; 716/129; 716/130; 716/122; 703/15

(58) Field of Classification Search
CPC ............ G06F 17/5081; G06F 17/5077; G06F 17/5072
USPC ...................... 716/135, 129, 130, 122; 703/15
See application file for complete search history.

(56) References Cited

U.S. PATENT DOCUMENTS

| | | | | |
|---|---|---|---|---|
| 6,653,666 | B2 * | 11/2003 | Mitlehner et al. | 257/134 |
| 8,274,099 | B2 * | 9/2012 | Becker | 257/206 |
| 8,405,163 | B2 * | 3/2013 | Becker et al. | 257/401 |
| 8,552,508 | B2 * | 10/2013 | Becker et al. | 257/401 |
| 8,561,003 | B2 * | 10/2013 | Kawa et al. | 716/132 |
| 2009/0114995 | A1 * | 5/2009 | Suzuki et al. | 257/369 |
| 2009/0280582 | A1 * | 11/2009 | Thijs et al. | 438/14 |
| 2012/0273899 | A1 * | 11/2012 | Wann et al. | 257/401 |
| 2012/0278776 | A1 * | 11/2012 | Lei et al. | 716/111 |
| 2012/0278777 | A1 * | 11/2012 | Lin et al. | 716/111 |
| 2012/0278781 | A1 * | 11/2012 | Wann et al. | 716/122 |
| 2013/0026572 | A1 * | 1/2013 | Kawa et al. | 257/347 |
| 2013/0174103 | A1 * | 7/2013 | Shieh et al. | 716/54 |

FOREIGN PATENT DOCUMENTS

| | | | | | |
|---|---|---|---|---|---|
| JP | 60160169 | A | * | 8/1985 | H01L 29/78 |
| JP | 61279173 | A | * | 12/1986 | H01L 27/14 |
| JP | 62156872 | A | * | 7/1987 | H01L 29/78 |

* cited by examiner

*Primary Examiner* — Phallaka Kik
(74) *Attorney, Agent, or Firm* — Eschweiler & Associates, LLC

(57) ABSTRACT

The present disclosure relates to a method of optimizing the area of series gate layout structures for FinFET devices. The method analyzes an integrated chip (IC) layout to determine a first gate material density along a first direction and to separately determine a second gate material density along a second direction based upon the first gate material density. A number of series gate stages for a FinFET (field effect transistor) device having a gate length along the second direction, is chosen based upon the second gate material density and one or more device performance parameters of the FinFET device. By analyzing the density of gate material in separate directions, the effective length of the gate of the FinFET can be increased without increasing the size of the transistor array.

20 Claims, 5 Drawing Sheets

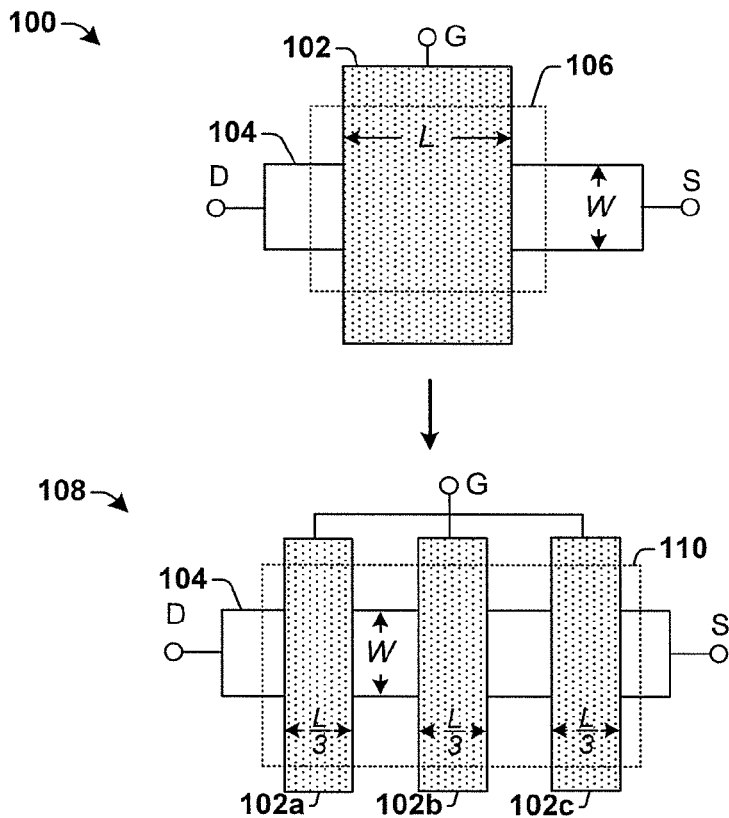
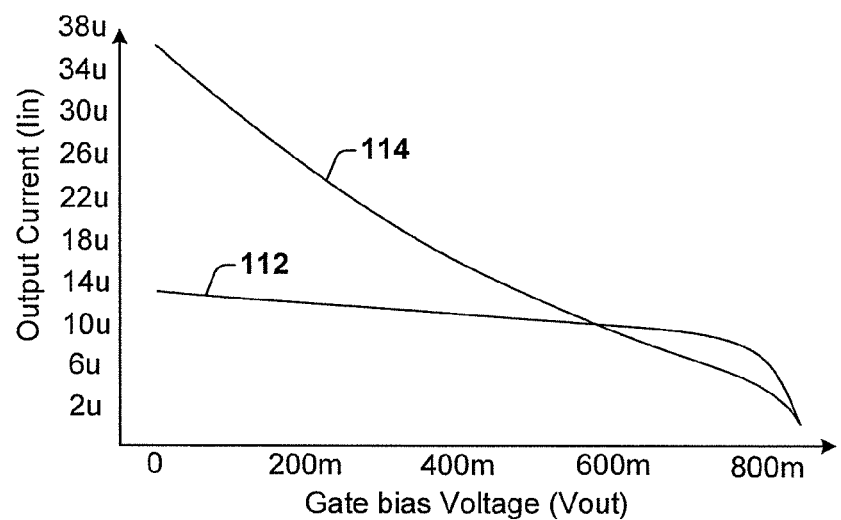
Fig. 1A
Fig. 1B

600 ↘

| Core Device | L(um) | S(um) | Gate material density in x-direction |
|---|---|---|---|
| SVT | 0.024 | 0.066 | 26.67% |
| SVT | 0.1 | 0.118 | 45.87% |
| SVT | 0.3 | 0.118 | 71.77% |
| SVT | 0.9 | 0.118 | 88.41% |

AREA OPTIMIZED SERIES GATE LAYOUT STRUCTURE FOR FINFET ARRAY

BACKGROUND

In recent years, fin field effect transistor ("FinFETs") devices have become an attractive option for next generation semiconductor devices. A FinFET device is a type of transistor that has a pillar or "fin" of semiconducting material that extends outward from a surface of an integrated chip. A conductive gate, covering a channel region of the fin, controls the flow of charge carriers between a source and drain of the fin.

For decades the performance of integrated chips (ICs) has been improved by reducing the size of IC components. As with conventional transistor devices, reducing the size of FinFET device components improves performance by, among other things, increasing the speed of the devices, increasing the density of the devices, and reducing the power consumption of devices. However, as the size of devices is reduced, processing problems and performance problems (e.g., gate leakage) arise.

BRIEF DESCRIPTION OF THE DRAWINGS

FIG. 1A shows layouts illustrating a series gate equivalent of a FinFET device having a long gate length.

FIG. 1B shows a graph illustrating a response of a pmos FinFET for a long gate length and for a series gate equivalent.

DETAILED DESCRIPTION

Figure 2:
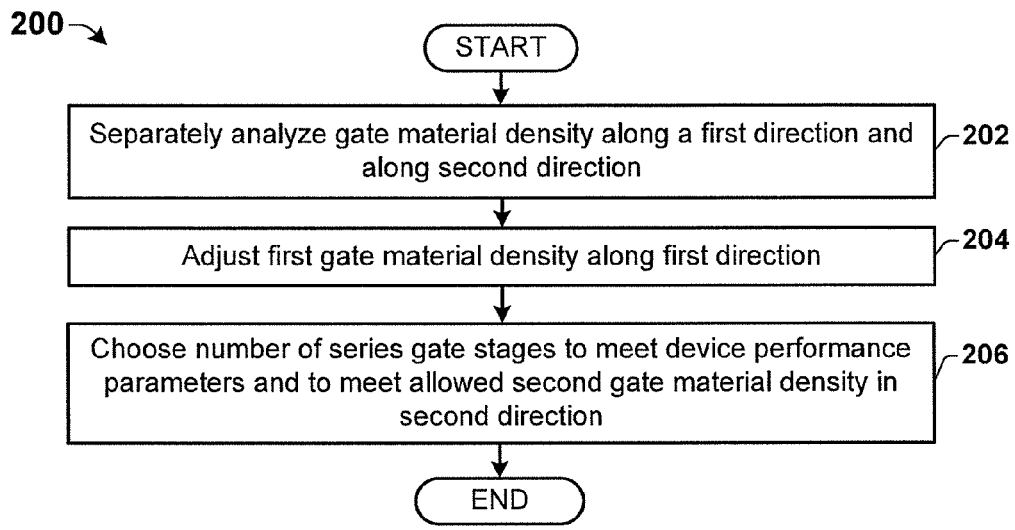
FIG. 2 is a flow diagram of some embodiments of a method for optimizing an area of a series gate layout for a FinFET device.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

In advanced technology nodes (e.g., 22 nm, 14 nm, etc.), the relatively small size of FinFET devices leads to a large leakage current in FinFET devices having a long gate length (e.g., a gate length greater than design rule minimum). For example, FIG. 1A illustrates an IC layout 100 comprising a FinFET device. The FinFET device has a gate 102 that extends over one or more fins 104 (i.e., active areas) of semiconductor material having channel regions located between a source (S) and a drain (D). The gate 102 has a length of L and a width of W. As the length L of the gate 102 increases, the gate leakage of the FinFET device also increases and process fabrication difficulties arise (e.g., since photo-processing is optimized for smallest gate sizes, larger gate sizes have photolithography issues).

To reduce gate leakage in FinFET devices having a long gate length, the FinFET in IC layout 100 can be replaced with (i.e., separated into) a plurality of separate FinFET devices as shown in IC layout 108. The plurality of FinFET devices in IC layout 108 have separate gates with shorter gate lengths of L/3, which share a common gate connection. The separate gates 102a-102c are connected in series (i.e., source drain connections are in series) such that the cumulative effective gate length of the three separate gates 102a-102c is equal to the gate length of the FinFET device in IC layout 108. As shown in the IV curve of FIG. 1B, separating a gate having a long gate length into separate gates connected in series provides for an IV curve 112 that shows an improved performance (e.g., $R_{out}$) over an IV curve 114 of a FinFET device having a long gate length.

While such a series gate connection decreases leakage due to long gate lengths, the spacing between gates increases the effective area of the FinFET device. For example, the FinFET device of IC layout 100 has an area of 106, which is smaller (e.g., by up to approximately 20~30%) than the effective area 110 of the series connected FinFET devices in IC layout 108. As the size of integrated chip designs is further reduced the effective area of series connected FinFET devices will continue to increase, since in modern technologies the area shrinkage ratio is limited by gate material density.

Accordingly, the present disclosure relates to a method of optimizing the area of series gate layouts for FinFET devices. The method comprises, analyzing an integrated chip (IC) layout to determine a first gate material density along a first direction and to separately determine a second gate material density along a second direction based upon the first gate material density. A number of series gate stages for a FinFET (field effect transistor) device having a gate length along the second direction, is chosen based upon the second gate material density and one or more device performance parameters of the FinFET device. As will be more fully appreciated below, by analyzing the density of gate material in separate directions, the effective length of the gate of the FinFET can be increased without increasing the size of the transistor array.

FIG. 2 is a flow diagram of some embodiments of a method 200 for providing an area optimized series gate layout for a FinFET device.

At act 202, a first gate material density of a gate material along a first direction and along a second gate material density of a gate material along a second direction are analyzed separately. In other words, a value of a first gate material density in a first direction is determined and a separate value of a second gate material density in a second direction is determined. In some embodiments, the first direction is perpendicular to the second direction.

At act 204, the first gate material density is adjusted along the first direction. In some embodiments, the first gate material density is adjusted by adjusting a spacing between adjacent gate material structures in the first direction. For example, by reducing a spacing between adjacent gate material structures (e.g., to a minimum allowable design rule spacing) in the first direction, the first gate material density can be increased.

At act 206, a number of series gate stages along the second direction are selected to meet device performance parameters and an allowable second gate material density. In some embodiments, since the overall gate material density is equal to the first gate material density multiplied by the second gate material density, the allowable second gate material density is determined by dividing an overall gate material density by the maximized first gate material density.

Therefore, method 200 separately analyzes gate material densities in separate directions, maximizes a first gate material density in a first direction, and then chooses a number of series gate stages, which optimize a second gate material density in a second direction, based upon the maximized first gate material density and one or more device performance parameters. By maximizing the first gate material density before selecting a number of series connected gate stages in the second direction, the overall area consumption of the series gate connected FinFET is optimized.

Figure 3:
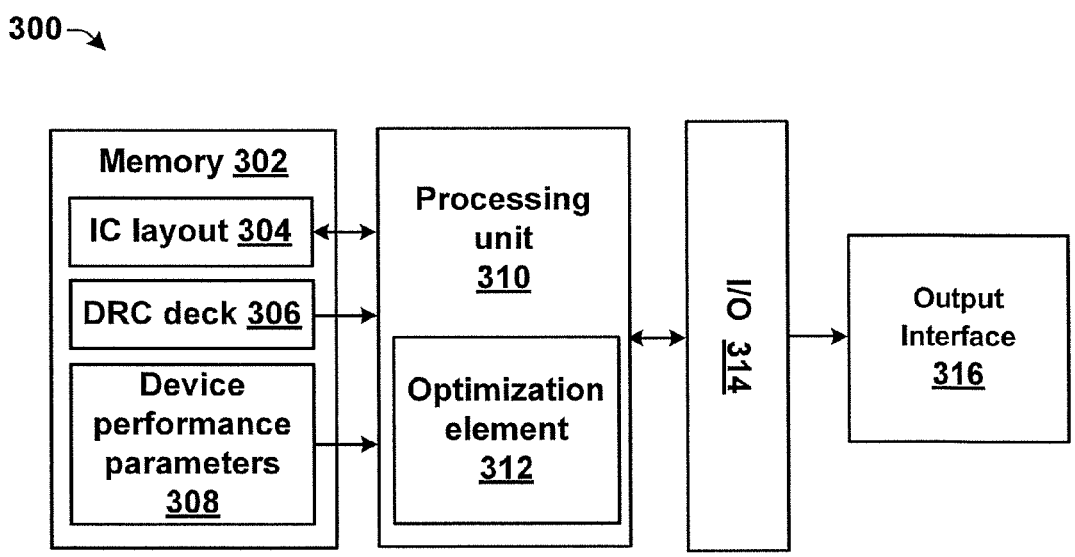
FIG. 3 illustrates some embodiments of a computer system configured to optimize the area of series gate layouts for FinFET devices.

FIG. 3 illustrates some embodiments of a computer system 300 configured to optimize the area of series gate layouts for FinFET devices. The computer system 300 includes a memory element 302 and a processing unit 310. In some embodiments, the memory element 302 comprises a machine readable storage medium, configured to store computer readable instructions for execution by processing unit 310, for example.

Memory element 302 is configured to store an IC layout 304, a DRC deck 306, and one more device performance parameters 308. The IC layout 304 comprises a graphical representation of an integrated chip, such as for example a GDSII file, comprising one or more FinFET devices. The FinFET devices may comprise a long gate FinFET having a single gate stage or a series gate connected FinFET having multiple gate stages connected in series. The DRC deck 306 comprises a list of design rules specific to a semiconductor process chosen for fabrication of the IC layout 304. The one or more device performance parameters 308 comprise parameters (e.g., $G_{ds}$, $R_{out}$) of the one or more FinFET devices within the IC layout 304. In some embodiments, the one or more device parameters are contained within the IC layout 304 (e.g., as a gate length of a long gate FinFET).

The processing unit 310 is configured to receive the IC layout 304, the DRC deck 306, and the one or more device performance parameters 308 as inputs. An optimization element 312 within the processing unit 310 is configured to separately analyze a density of a gate material layer in a first direction and in a second direction of the IC layout 304. The optimization element 312 is configured to adjust one or more gate material structures within the IC layout 304 to increase the first gate material density. For example, in some embodiments, the optimization element 312 is configured to adjust a first gate material density by reducing spacing between adjacent gate material structures along the first direction to a minimum allowed design rule spacing. Changing the spacing to a minimum allowed design rule spacing achieves a maximized first gate material density along the first direction.

The optimization element 312 is further configured to determine a maximum allowable second gate material density along the second direction based upon the DRC deck 306 and the maximized first gate material density (e.g., by dividing a maximum overall density design rule by the maximum first gate material density). The optimization element 312 then generates an adjusted IC layout having a size and number of series gate connections selected based upon the maximum allowable second gate material density along the second direction and the one or more device performance parameters 308.

For example, in some embodiments the optimization element 312 may receive an IC layout 304 having a long gate FinFET device comprising a long gate length or a series gate connected FinFET device comprising a plurality of series gate stages that provide for one or more device parameters 308. The optimization element 312 is configured to analyze and optimize a gate material density in a first direction of the IC layout 304. The optimization element 312 is configured to then generate an adjusted IC layout having the long gate FinFET device or the series gate connected FinFET device replaced with a series gate connected FinFET device having a size and number of gate stages that is dependent upon a maximum second allowable density and the one or more device parameters 308.

In some embodiments, the DRC deck 306 is run against the adjusted IC layout to determine if the IC layout conforms to DRC rules (e.g., maximum overall density design rules, minimum spacing design rules, etc.). If the adjusted IC layout is DRC clean then it is acceptable. If the adjusted IC layout is not DRC clean then the optimization element 312 is configured to adjust the size and/or number of series connected gates in the adjusted IC layout to generate an adjusted IC layout that is DRC clean and which has an area that is less than the area of a FinFET device having a single stage with a gate length equal to the sum of the gate lengths of the series gate stages.

In some embodiments, the adjusted IC layout is provided by way of an I/O 314 to an output interface 316 that allows the processing unit 310 to exchange information with the external environment. The output interface 316 may comprise a visual output (e.g., an LCD or LED screen), for example.

Figure 4:
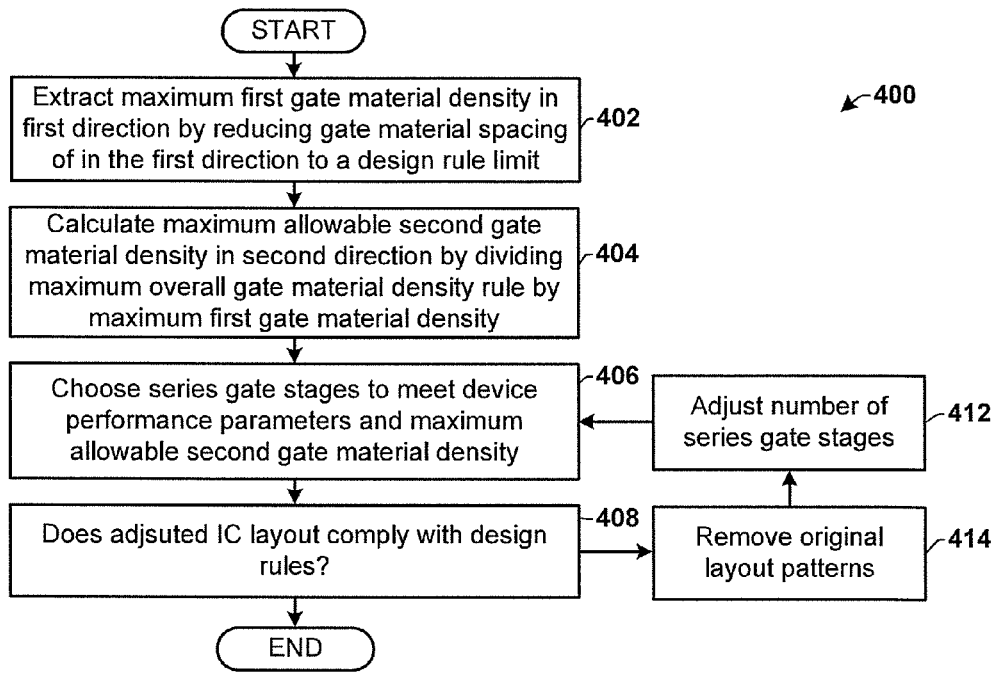
FIG. 4 is a flow diagram of some embodiments of a method for optimizing an area of series gate layouts for FinFET devices.

FIG. 4 is a flow diagram of some embodiments of a method 400 for optimizing an area of series gate layouts for FinFET devices.

While the disclosed methods (e.g., methods 200 and 400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 402, a maximum first gate material density in a first direction of an IC layout is extracted by reducing gate material spacing in the first direction to a design rule limit. In some embodiments, the maximum first gate material density comprises a maximum density of a high k metal gate material. In other embodiments, the maximum first gate material density may comprise a maximum density of an alternative gate material such as a polysilicon gate density, for example.

At act 404, a maximum allowable second gate material density in a second direction of the IC layout is determined by dividing a maximum overall gate material density rule by the maximum first gate material density. In some embodiments, the first direction is perpendicular to the second direction.

At act 406, an adjusted IC layout is generated having a number of series gate stages that is chosen to meet device performance parameters and the maximum allowable second gate material density.

At act 408, the design rule checking is applied to the adjusted IC layout. The design rule checking applies one or more design rules to the adjusted IC layout. For example, the design rule checking may check to ensure that the adjusted IC layout complies with a maximum overall gate material density rule, with minimum spacing rules, etc.

If the adjusted IC layout is compliant with the design rule checking, method 400 ends. The resulting adjusted IC layout comprises a plurality of series gate connected FinFET devices, which collectively have a reduced area consumption in comparison to a long gate FinFET device comprising a long gate length.

If the adjusted IC layout is not compliant with the design rule checking, the original layout patterns are removed (act 412) and a number of series gate stages is adjusted (act 414) to meet the one or more device performance parameters and the allowable second gate material density.

Figure 5:
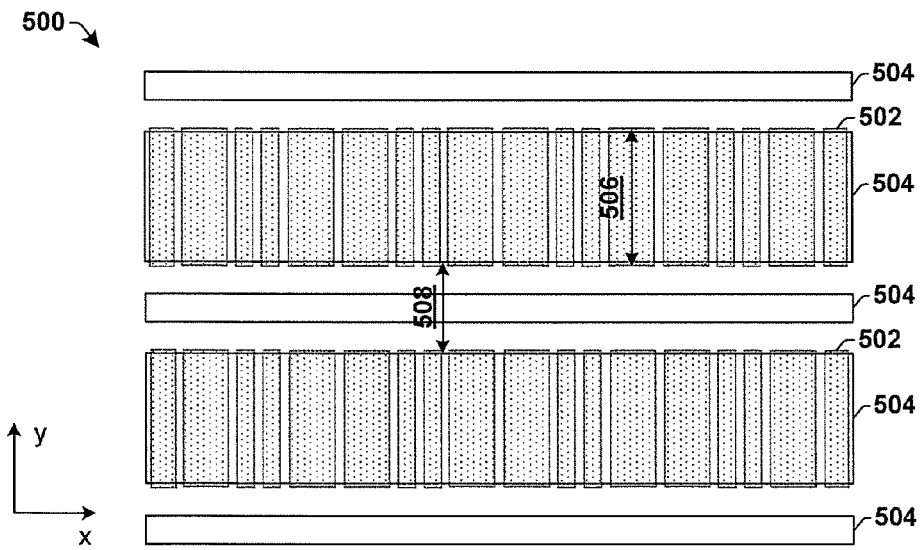
FIG. 5 illustrates some embodiments of an integrated chip (IC) layout whereon method for optimizing an area of series gate layouts for FinFET devices is implemented.

FIG. 5 illustrates an integrated chip (IC) layout 500 whereon a method of optimizing the area of a series connected gate (e.g., method 400) is implemented.

The IC layout 500 comprises a plurality of series gate connected FinFET devices, in which the source and drain of adjacent FinFET devices are connected together. Respective FinFET devices comprise one or more gates 502 positioned over a common active area 504 (i.e., a common 'fin'). The one or more gates 502 have a width along a y-axis and a length along an x-axis. Although the one or more gates 502 are shown as extending over a single active area 504, it will be appreciated that in some embodiments the one or more gates 502 may extend over multiple active areas 504 (i.e., multiple fins).

A first gate material density along the y-axis is determined based upon a gate material thickness 506 and a gate material spacing 508. The first gate material density can be increased to a maximum density by adjusting a gate material spacing 508 between the one or more gates 502 along the y-axis. For example, an original gate material spacing of 1.76 um, between gates 502 having a thickness of 2.5 um, can be reduced to comply with a minimum gate material design rule spacing of 300 nm. In such an example, reducing the gate material spacing 508 from the original gate material spacing of 1.76 um to the minimum gate material design rule spacing of 300 nm increases the first gate material density in the y-direction to a value that is approximately 89% (i.e., resulting in a reduction in area of (2500 nm+300 nm)/(2500 nm−1760 nm)−1=−36%).

After a first gate material density is determined, a maximum allowable second gate material density along the x-axis is determined based upon a maximum overall gate material density and the first gate material density. For example, to determine a maximum allowable second gate material density a maximum overall gate material density of 50% is divided by the first gate material density of 89% to provide a maximum allowable second gate material density of approximately 55%.

The length and number of series gates in a FinFET device can be varied to meet the maximum allowable second gate material density, since gate material density is dependent on gate length (i.e., the thickness of the gate material gates in the x-direction). In particular, because of processing limitations (e.g., wide line etching) gates having a large length require a larger minimum spacing. For example, if a gate material length is below a certain value, gate material to gate material minimum spacing is a first number. Alternatively, if a gate material length is equal to or above a certain value, gate material to gate material minimum spacing is a second number.

Figures 6, 7A:
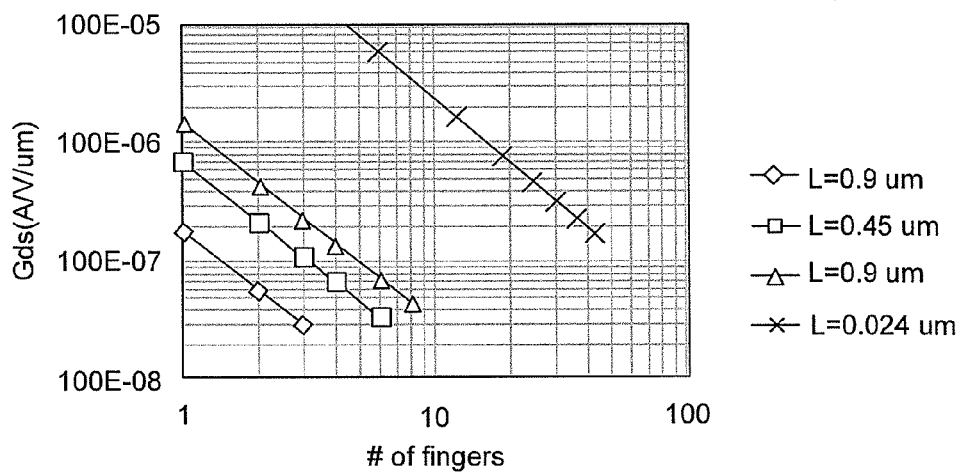
FIG. 6 is a table showing exemplary gate material densities as a function of gate length.
FIGS. 7A and 7B illustrates graphs showing exemplary performance parameters of a FinFET device for different series gate layout structures.

FIG. 6 illustrates a table 600 showing some exemplary gate material densities in the second, x-direction as a function of gate length.

As shown in table 600, the gate material to gate material minimum spacing defines a gate material density (e.g., density=gate length/(minimum spacing+gate length)). For example, a series of gates having a length of 0.024 um and a gate-to-gate spacing of 0.066 um results in a gate material density of approximately 26.67%. A series of gates having a length of 0.1 um and a gate-to-gate spacing of 0.118 um results in a gate material density of approximately 45.87%.

Since longer gate lengths can provide for higher gate material density in the second, increases in the first gate material density can be offset by varying the size of gate length in the second direction. In other words, as the first gate material density increases, the overall gate material density can be reduced by reducing the gate length of gates in the second direction.

Figure 7B:
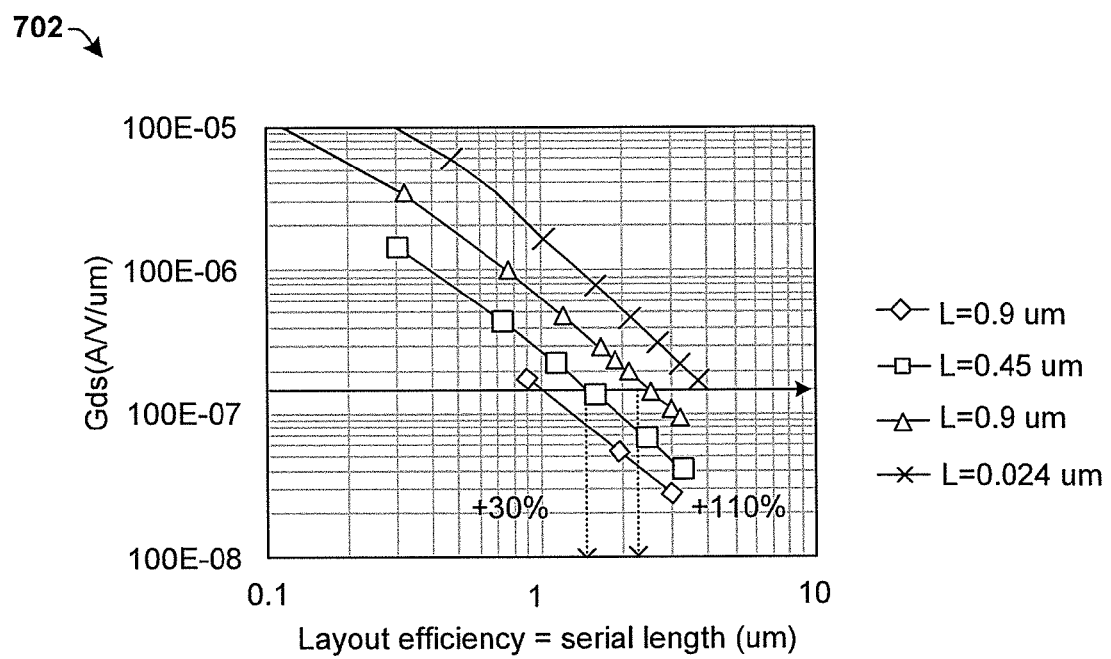

FIGS. 7A and 7B illustrates graphs, 700 and 702, showing performance parameters of a FinFET for different gate series stages and for different gate lengths.

Graph 700 shows a conductance of a FinFET device (y-axis) as a function of a number of FinFETs connected in series (x-axis).

As shown in graph 700, different gate lengths having a different number of gate stages provide for different conductance (e.g., Gds=1/Rout). For example, the conductance of a FinFET device having a single stage with a gate length of 0.9 um has a conductance of approximately 1.0E-07 A/V/um. The conductance of a FinFET device having two series gate stages with gate lengths of 0.9 um is reduced to approximately 5.0E-08 A/V/um.

Also, graph 700 illustrates that as the gate length decreases, the conductance increases (and Rout decreases) For example, the conductance of a FinFET device having two series gate stages with gate lengths of 0.9 um has a conductance of approximately 5.0E-08 A/V/um, while the conductance of a FinFET gate stages having two series gate stages with gate lengths of 0.45 um has a larger conductance of approximately 1.0E-07 A/V/um.

FIG. 7B is a graph 702 showing a conductance of a FinFET device (y-axis) as a function of a serial length of the FinFET device gates. For example, the series length for a FinFET device having a single gate stage with a gate length of 0.9 um is 0.9 um, while the series length for a FinFET device having two gate stages with gate lengths of 0.9 um is 0.9×2=1.8 um.

The conductance of a FinFET device is inversely proportional to the serial length of the FinFET device. For example, a FinFET device having a single stage that provides a serial length of 0.9 um has a conductance of approximately 2.0E-07 A/V/um, while a FinFET device having two gate stages that provide a serial length 1.8 um has a conductance of approximately 5.0E-08 A/V/um. Therefore, by changing the x-axis from stack number (graph 700) to series length (graph 702), an allowable area in the second, x-direction can be easily calculated since gate series along a horizontal line provide for a same conductance.

For example, a target conductance of 2.0E-07 A/V/um can be achieved by a FinFET device having a single stage with a gate length of 0.9 um or by a FinFET device having four stages with a gate length of 0.3 um. The area increase for such a FinFET device having four stages in second, x-direction is about 1.25 (for same electrical performance as the FinFET having a single stage with a gate length of 0.9 um). However, since the area along the first direction, y-direction is lower, the overall area is lower. For example, if the area in the first, y-direction is reduced by 36% and the area in the second, y-direction is increased by 25%, the overall area of the series connected FinFET is reduced by approximately 20% (e.g., total area is 0.64*1.25=0.8).

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs. Additionally, layers described herein can be formed in any suitable manner, such as with spin on, sputtering, growth and/or deposition techniques, etc.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a method and apparatus for optimizing the area of a FinFET device having a plurality of gates connected in series.

In some embodiments, the present disclosure relates to a method of optimizing the area of a FinFET device having a plurality of gates connected in series. The method comprises analyzing an integrated chip (IC) layout to determine a first gate material density along a first direction and to separately determine a second gate material density along a second direction based upon the first gate material density. The method further comprises choosing a number of series gate stages for a FinFET (field effect transistor) device having a gate length along the second direction, based upon the second gate material density and one or more device performance parameters of the FinFET device.

In other embodiments, the present disclosure relates to a method of optimizing placement of series gates in a FinFET (field effect transistor) device. The method comprises determining a first gate material density along a first direction and adjusting the first gate material density by varying spacing between gate material shapes along the first direction to achieve a maximized first gate material along the first direction. The method further comprises determining a second gate material density along a second direction perpendicular to the first direction by dividing a maximum gate material design rule value by the maximum gate material density in the first direction and choosing a number of series gate stages for a FinFET device having a gate length along the second direction, based upon the first gate material density and one or more device performance parameters of the FinFET device.

In other embodiments, the present disclosure relates to a system. The system comprises a memory element configured to store an IC layout comprising one or more FinFET (field effect transistor) devices. The system further comprises a processor coupled to the memory element and configured for performing the steps of: separately analyzing an integrated chip (IC) layout to determine a first gate material density along a first direction and a second gate material density along a second direction, and choosing a number of series gate stages for a FinFET (field effect transistor) device having a gate length along the second direction, based upon the first gate material density and one or more device performance parameters of the FinFET device.

What is claimed is:

1. A method of optimizing an area of a FinFET (field effect transistor) device having a plurality of gates connected in series, comprising:
    analyzing an integrated chip (IC) layout by using a computer system to determine a first gate material density along a first direction and to separately determine a second gate material density along a second direction based upon the first gate material density; and
    using the computer system to choose a number of series gate stages for a FinFET (field effect transistor) device having a gate length along the second direction, based upon the second gate material density and one or more device performance parameters of the FinFET device.

2. The method of claim 1, further comprising:
    adjusting the first gate material density by using the computer system to vary spacing between gate material shapes along the first direction to achieve a maximized first gate material along the first direction.

3. The method of claim 1, further comprising:
    calculating the gate density in the second direction by dividing a maximum gate material design rule value by the maximum gate material density in the first direction.

4. The method of claim 1, further comprising:
    operating upon the series gate stage with a design rule checking comprising one or more design rules;
    removing original layout patterns that are not compliant with the design rule checking; and
    adjusting a number of series gate stages to meet device performance parameters and the design rule checking.

5. The method of claim 1, wherein the one or more device performance parameters comprise a conductance of the FinFET device.

6. The method of claim 1, wherein the series gate stage of the FinFET device provides for an area that is less than the area of a FinFET device having a single stage with a gate length equal to the sum of the gate lengths of the series gate stages.

7. The method of claim 1, wherein the gate material comprises a high-k metal gate.

8. The method of claim 1, wherein choosing the number of series gate stages for the FinFET device, comprises:
    determining a gate length that provides a gate material density that is within a maximum gate material density in the second direction; and
    determining the number of series gates for a conductance of the FinFET device that complies with the gate length.

9. The method of claim 1, wherein the first direction is perpendicular to the second direction.

10. A method of optimizing placement of series gates in a FinFET (field effect transistor) device, comprising:
    determining a first gate material density along a first direction using a computer system; and adjusting the first gate material density by using the computer system to vary spacing between gate material shapes along the first direction to achieve a maximized first gate material density along the first direction;

determining a second gate material density along a second direction perpendicular to the first direction by using the computer system to divide a maximum gate material design rule value by the maximized first gate material density along the first direction; and using the computer system to choose a number of series gate stages for a FinFET device having a gate length along the second direction, based upon the first gate material density and one or more device performance parameters of the FinFET device.

11. The method of claim 10, further comprising:

operating upon the series gate stage with a design rule checking comprising one or more design rules;

removing original layout patterns that are not compliant with the design rule checking; and adjusting a number of series gate stages to meet device performance parameters and the design rule checking.

12. The method of claim 10, wherein the one or more device performance parameters comprise a conductance of the FinFET device.

13. The method of claim 10, wherein the series gate stage of the FinFET device provides for an area that is less than the area of a FinFET device having a single stage with a gate length equal to a sum of the gate lengths of the series gate stages.

14. The method of claim 10, wherein choosing the number of series gate stages for the FinFET device, comprises:

determining a gate length that provides a gate material density that is within the maximum gate material density in the second direction; and determining the number of series gates for a conductance of the FinFET device that complies with the gate length.

15. A system, comprising:

a memory element configured to store an IC layout comprising one or more FinFET (field effect transistor) devices;

a processor coupled to the memory element and configured for performing the steps of:

separately analyzing an integrated chip (IC) layout to determine a first gate material density along a first direction and a second gate material density along a second direction; and choosing a number of series gate stages for a FinFET (field effect transistor) device having a gate length along the second direction, based upon the first gate material density and one or more device performance parameters of the FinFET device.

16. The system of claim 15, further comprising:

adjusting the first gate material density by varying spacing between gate material shapes along the first direction to achieve a maximized first gate material density along the first direction.

17. The system of claim 16, further comprising:

calculating the gate density in the second direction by dividing a maximum gate material design rule value by a maximized first gate material density in the first direction.

18. The system of claim 15, further comprising:

operating upon the series gate stage with a design rule checking comprising one or more design rules;

removing original layout patterns that are not compliant with the design rule checking; and adjusting a number of series gate stages to meet device performance parameters and the design rule checking.

19. The system of claim 15, wherein the series gate stage of the FinFET device provides for an area that is less than the area of a FinFET device having a single stage with a gate length equal to a sum of the gate lengths of the series gate stages.

20. The system of claim 15, wherein choosing the number of series gate stages for the FinFET device, comprises:

determining a gate length that provides a gate material density that is within a maximum gate material density in the second direction; and determining the number of series gates for a conductance of the FinFET device that complies with the gate length.

* * * * *